US012500136B2

(12) United States Patent
Wang et al.

(10) Patent No.: US 12,500,136 B2
(45) Date of Patent: Dec. 16, 2025

(54) CHIP MODULE AND ELECTRONIC DEVICE

(71) Applicant: HUAWEI TECHNOLOGIES CO., LTD., Guangdong (CN)

(72) Inventors: Feng Wang, Shenzhen (CN); Youhu Zhao, Dongguan (CN); Yalei Zhang, Dongguan (CN); Yangyun Xie, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 538 days.

(21) Appl. No.: 17/985,327

(22) Filed: Nov. 11, 2022

(65) Prior Publication Data

US 2023/0084279 A1 Mar. 16, 2023

Related U.S. Application Data

(63) Continuation of application No. PCT/CN2021/090007, filed on Apr. 26, 2021.

(30) Foreign Application Priority Data

May 13, 2020 (CN) .......................... 202010401964.2

(51) Int. Cl.
*H01L 23/40* (2006.01)
*H01L 23/00* (2006.01)

(52) U.S. Cl.
CPC ........ *H01L 23/4006* (2013.01); *H01L 23/562* (2013.01); *H01L 2023/4081* (2013.01); *H01L 2023/4087* (2013.01)

(58) Field of Classification Search
CPC ... H01L 23/31; H01L 23/3114; H01L 23/367; H01L 23/373; H01L 23/40;
(Continued)

(56) References Cited

U.S. PATENT DOCUMENTS 5,699,610 A * 12/1997 Shimada ................ H05K 3/301
257/E23.084
5,944,093 A * 8/1999 Viswanath .......... H01L 23/4006
174/15.2

(Continued)

FOREIGN PATENT DOCUMENTS

| CN | 102130102 A | 7/2011 |
| CN | 102301467 A | 12/2011 |

(Continued)

OTHER PUBLICATIONS

JP-2000133769-A English Translation (Year: 2000).*

(Continued)

*Primary Examiner* — Amir A Jalali

(57) ABSTRACT

A chip module includes a circuit board, a slot disposed on a surface of one side of the circuit board, a lidless packaged chip, a heat radiator, and a substrate fixing assembly. The lidless packaged chip includes a substrate and a die packaged on the substrate. The slot is electrically connected to the circuit board, the lidless packaged chip has a connecting part on one side of the substrate facing away from the die, and the connecting part is inserted into the slot. The heat radiator is press-fitted on one side of the die facing away from the circuit board. The substrate fixing assembly is press-fitted at a periphery of one side of the substrate facing away from the circuit board and avoids the die.

18 Claims, 14 Drawing Sheets

(58) Field of Classification Search
CPC ............. H01L 23/4006; H01L 23/4338; H01L 23/473; H01L 23/48; H01L 23/562; H01L 2023/4081; H01L 2023/4087; H01L 24/16; H01L 24/72; H01L 24/90; H05K 1/0203; H05K 5/0052; H05K 5/0221; H05K 5/03; H05K 7/1038; H05K 7/2039

See application file for complete search history.

(56) References Cited

U.S. PATENT DOCUMENTS

| | | | |
|---|---|---|---|
| 6,007,357 A | 12/1999 | Perino et al. | |
| 6,731,505 B1* | 5/2004 | Goodwin | H01L 23/4093 |
| | | | 24/458 |
| 7,342,796 B2* | 3/2008 | Aukzemas | F16B 37/145 |
| | | | 361/719 |
| 7,428,154 B2 | 9/2008 | Ishimine et al. | |
| 7,471,517 B1* | 12/2008 | Desrosiers | H05K 7/1053 |
| | | | 165/185 |
| 9,118,141 B2* | 8/2015 | Yeh | H05K 7/1053 |
| 9,681,556 B2* | 6/2017 | Llapitan | H05K 7/1007 |
| 9,887,154 B2* | 2/2018 | Takahashi | H01L 23/49894 |
| 10,455,685 B1* | 10/2019 | Klein | H01L 23/4006 |
| 2002/0180039 A1* | 12/2002 | Hensley | H05K 7/1007 |
| | | | 257/730 |
| 2004/0084764 A1* | 5/2004 | Ishimine | H01L 23/4006 |
| | | | 257/E23.084 |
| 2006/0202325 A1* | 9/2006 | Coico | H01L 23/4006 |
| | | | 257/E23.084 |
| 2006/0232944 A1 | 10/2006 | Zhang et al. | |
| 2008/0068817 A1* | 3/2008 | Morita | H01L 23/433 |
| | | | 361/767 |
| 2010/0055958 A1 | 3/2010 | Lin et al. | |
| 2010/0099294 A1* | 4/2010 | Yeh | H05K 7/1053 |
| | | | 29/874 |
| 2011/0034057 A1 | 2/2011 | Hsu et al. | |
| 2011/0134606 A1* | 6/2011 | Gallarelli | H05K 7/1007 |
| | | | 361/679.54 |
| 2011/0157858 A1 | 6/2011 | Jung et al. | |
| 2011/0230063 A1 | 9/2011 | Tang et al. | |
| 2011/0287639 A1 | 11/2011 | Hsu | |
| 2012/0009810 A1 | 1/2012 | French, Jr. et al. | |
| 2012/0162923 A1* | 6/2012 | Lee | H01L 23/4006 |
| | | | 174/250 |
| 2014/0162473 A1 | 6/2014 | Aoki et al. | |
| 2017/0236809 A1 | 8/2017 | Trimberger et al. | |
| 2017/0288331 A1* | 10/2017 | Cheng | H01R 13/639 |
| 2019/0150311 A1* | 5/2019 | Mason | H05K 3/3436 |
| | | | 439/55 |
| 2020/0126889 A1 | 4/2020 | Mao et al. | |

FOREIGN PATENT DOCUMENTS

| | | |
|---|---|---|
| CN | 108431946 A | 8/2018 |
| CN | 110021591 A | 7/2019 |
| CN | 209747498 U | 12/2019 |
| JP | 2000133769 A * | 5/2000 |
| JP | 2002290073 A | 10/2002 |
| JP | 2003086765 A | 3/2003 |
| JP | 2008077947 A | 4/2008 |
| TW | 200531232 A | 9/2005 |

OTHER PUBLICATIONS

International Search Report and Written Opinion issued in PCT/CN2021/090007, dated Jul. 15, 2021, 11 pages.

Korean Office Action for Application No. 9-5-2024-017831327 dated Feb. 28, 2024, 6 pages.

* cited by examiner

CHIP MODULE AND ELECTRONIC DEVICE

CROSS-REFERENCE TO RELATED APPLICATIONS

This application is a continuation of International Application No. PCT/CN2021/090007, filed on Apr. 26, 2021, which claims priority to Chinese Patent Application No. 202010401964.2, filed on May 13, 2020. The disclosures of the aforementioned applications are hereby incorporated by reference in their entireties.

TECHNICAL FIELD

This application relates to the field of electronic technologies, and in particular, to a chip module and an electronic device.

BACKGROUND

With development of technologies and increase of interfaces on a packaged chip, power consumption and a chip size are larger, and a higher requirement is posed on heat dissipation performance Because a lid of a lidded packaged chip obstructs heat dissipation of the chip, a heat dissipation effect of the lidded packaged chip is poor. Therefore, a packaged chip structure also develops from a lidded packaged chip to a lidless packaged chip. When the packaged chip is used, the packaged chip needs to be connected to a circuit board to form a chip module. In the conventional technology, a solder ball is used to implement the connection between the packaged chip and the circuit board. In this connection mode, because materials of various parts of the packaged chip are different and expansion coefficients are different, a warp is prone to occur during soldering, and there is a potential risk of solder ball cracking. Therefore, reliability of the connection between the packaged chip and the circuit board is low. Therefore, the connection between the packaged chip and the circuit board can be implemented by using a slot. An elastic terminal is provided in the slot, and the packaged chip is pressed into the slot, so that a connecting part of the packaged chip is in reliable contact with the elastic terminal in the slot to connect the packaged chip to the circuit board. In the conventional technology, a heat radiator is press-fitted on the lid of the lidded packaged chip, and the lidded packaged chip can be reliably connected to the circuit board by using the lid. For the lidless packaged chip, because the lidless packaged chip does not have a lid, and surface flatness of one side of the lidless packaged chip facing away from the circuit board is poor, pressure of the heat radiator cannot be evenly distributed. On one hand, the heat radiator is prone to be skewed, and a die cannot be attached, resulting in a poor heat dissipation effect of the lidless packaged chip. On the other hand, when the heat radiator is skewed, the die may be crushed, causing damage to the lidless packaged chip.

SUMMARY

This application provides a chip module and an electronic device, to reliably connect a lidless packaged chip to a circuit board by using a slot and improve a heat dissipation effect of a heat radiator.

According to a first aspect, this application provides a chip module. The chip module includes a circuit board, a slot disposed on a surface of one side of the circuit board, a lidless packaged chip, a heat radiator, and a substrate fixing assembly. The lidless packaged chip includes a substrate and a die packaged on the substrate. The slot is electrically connected to the circuit board, the lidless packaged chip has a connecting part on one side of the substrate facing away from the die, and the connecting part is inserted into the slot, so that the connecting part is connected to an elastic terminal in the slot. The heat radiator is press-fitted on one side of the die facing away from the circuit board, to press a middle part of the lidless packaged chip toward the slot, so that the connecting part at the middle part of the lidless packaged chip is reliably connected to the elastic terminal in the slot. The substrate fixing assembly is press-fitted at a periphery of one side of the substrate facing away from the circuit board and avoids the die, to press an edge of the lidless packaged chip toward the slot, so that the connecting part at the edge of the lidless packaged chip is reliably connected to the elastic terminal in the slot. In this solution, a middle area of the lidless packaged chip having the die is pressed toward the slot by using the heat radiator, and an edge area of the substrate of the lidless packaged chip is pressed toward the slot by using the substrate fixing assembly, so that reliability of the connection between the lidless packaged chip and the slot is high. The chip module may use the slot to implement the connection between the lidless packaged chip and the circuit board, and the connection reliability is high. In addition, a heat dissipation effect of the lidless packaged chip is good, and the chip module has a good heat dissipation effect and good performance.

To improve strength of the lidless packaged chip, a reinforcing rib may be further disposed on the substrate. The reinforcing rib and the die are disposed on a same side of the substrate, and the reinforcing rib is disposed around the die. Therefore, strength of the substrate is high. The substrate fixing assembly can be in contact with one side of the reinforcing rib facing away from the substrate. The solution can enhance the strength of the lidless packaged chip.

When the heat radiator and the substrate fixing assembly are specifically mounted, pressure F1 between the heat radiator and the die and pressure F2 between the substrate fixing assembly and the substrate may satisfy: F1>F2. Usually, the lidless packaged chip has a crying warp, that is, a die area of the lidless packaged chip is bent in a direction away from the circuit board. In the technical solution of this application, the pressure F1 applied to the die area is set to be greater than the pressure F2 applied to the edge area. Therefore, a part of force in F1 can be used to correct the crying warp of the lidless packaged chip, and this further makes the lidless packaged chip reliably connected to the slot.

A specific structure of the substrate fixing assembly is not limited. In a specific implementation, the substrate fixing assembly may be an upper cover, and the upper cover has a hollow structure, so that the die is in contact with the heat radiator. In this solution, the upper cover may be used as a cover, or may be press-fitted on the substrate as a substrate fixing assembly.

When the upper cover is specifically disposed, the upper cover may be an integral structure, or may be formed by splicing sub-cover parts.

To mount the chip module, a lower cover is further included. The lower cover is disposed on one side of the circuit board facing away from the substrate. To facilitate mounting, a pre-tightening assembly is disposed between the upper cover and the lower cover, and the pre-tightening assembly makes the upper cover and the lower cover close to each other, to adjust pressure of the lower cover on the substrate when the lower cover is specifically mounted, so that skewing is unlikely to occur. In particular, for a chip module with a larger size, an anti-tilt effect is better.

The pre-tightening assembly has a plurality of optional structures. In a technical solution, the pre-tightening assembly includes a pre-tightening screw and a spring sleeved outside the pre-tightening screw. Therefore, when the spring is in an energy storage state, the lower cover and the upper cover can be close to each other.

When the upper cover is press-fitted on the substrate, the upper cover and the lower cover may be connected by using a first fastening screw. To control the pressure F2 applied by the upper cover to the substrate to satisfy a requirement, a spring is sleeved outside the first fastening screw. The spring is in an energy storage state and is used to provide pressure for pressing the upper cover toward the substrate, so that the upper cover is pressed toward the substrate with specified pressure and that a connecting part of the substrate is reliably connected to the elastic terminal in the slot.

Alternatively, in another technical solution, the upper cover may have an elastic metal, and the elastic metal is press-fitted on the substrate. In this solution, no spring needs to be sleeved outside the first fastening screw, and mechanical properties of the elastic metal are better than those of a spring. When the elastic metal is compressed, overpressure is unlikely to occur, and reliability is high.

Alternatively, in another technical solution, the upper cover may include a bracket and a pressing metal, and the pressing metal is press-fitted on one side of the substrate facing away from the circuit board. The pressing metal and the bracket are connected by using a spring set. The spring set is in a compressed state and is configured to provide pressure for press-fitting the pressing metal on the substrate. In this solution, no spring needs to be sleeved outside the first fastening screw either. The spring set between the pressing metal and the bracket can enable the pressing metal to apply specified pressure to the substrate.

During mounting of the heat radiator, the heat radiator may be mounted on the upper cover and/or the lower cover by using a second fastening screw. To control the pressure F1 applied by the heat radiator to the die to satisfy a requirement, a spring is also sleeved outside the second fastening screw. The spring is in an energy storage state and is used to provide pressure for pressing the heat radiator toward the die, so that the heat radiator is pressed toward the die with specified pressure and that the lidless packaged chip is reliably connected to the slot.

Specifically, each spring may be a pre-tightening spring, that is, torque of the pre-tightening spring may be preset, and specified pressure may be formed through direct mounting. Alternatively, the spring may be a compression spring, and required pressure may also be obtained by adjusting torque of a torque screwdriver when the screw is mounted.

During mounting of the heat radiator, a latch may alternatively be used as a pre-mounting structure. Specifically, a plurality of latches may be fixed to the lower cover, an edge of the heat radiator has a protrusion, and the latches are clamped with the protruding edge of the heat radiator in a direction from the heat radiator to the lower cover, so that the heat radiator can be pre-mounted. The heat radiator is prevented from being skewed during subsequent mounting of the heat radiator, and further, damage caused to the die by pressing edges or sharp corners of the die by the heat radiator can be reduced.

The lower cover may be a pre-bent lower cover. The pre-bent lower cover is in a natural state, that is, when the pre-bent lower cover is not mounted, an edge of the pre-bent lower cover is bent along a direction away from the circuit board. In this solution, a bending direction of the pre-bent lower cover is opposite to a warping direction of the lidless packaged chip, to counteract the warp of the lidless packaged chip and prevent the chip module from warping.

Alternatively, the lower cover may be an I-shaped lower cover. After the chip module is mounted, the screw makes a peripheral side of the I-shaped lower cover close, so that a middle part of the lower cover is raised. This can counteract the warp of the lidless packaged chip and prevent the chip module from warping.

To improve the heat dissipation effect of the lidless packaged chip, a surface of the upper cover facing toward the heat radiator is provided with a heat conduction layer, and a surface of the upper cover facing away from the heat radiator is provided with a heat conduction layer, so that heat of the lidless packaged chip is transferred to the heat radiator.

In another technical solution, the substrate fixing assembly may include a plurality of elastic pressing blocks, the heat radiator may have an accommodating groove for mounting the elastic pressing blocks, and the elastic pressing blocks are disposed in the accommodating groove. The elastic pressing blocks are press-fitted on a peripheral side of the substrate to press the edge of the lidless packaged chip toward the slot, thereby improving reliability of the connection between the lidless packaged chip and the circuit board. The elastic pressing block may include a spring and a pressing block. The spring is disposed between the pressing block and a bottom wall of the accommodating groove and is in a compressed state, so that the pressing block is pressed toward the substrate.

According to a second aspect, this application further provides an electronic device. The electronic device includes the chip module in any one of the foregoing technical solutions. The chip module of the electronic device has a good heat dissipation effect, and the connection between the lidless packaged chip and the circuit board is reliable.

Figure 1:
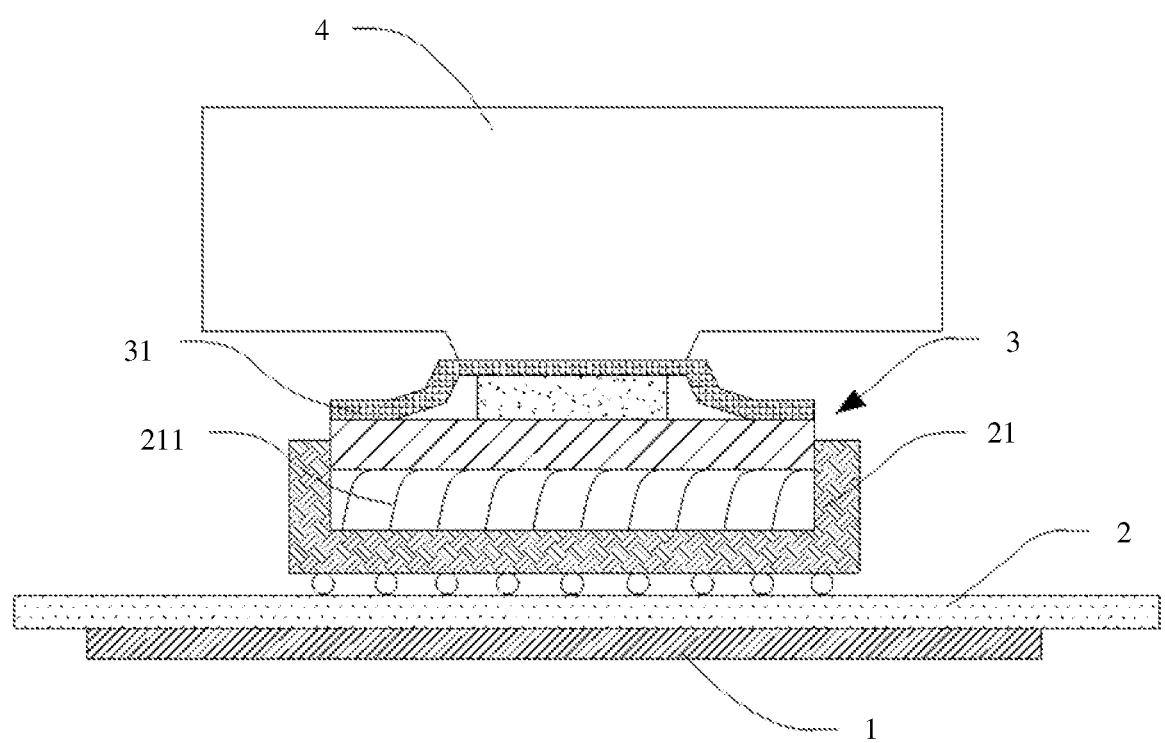
FIG. 1 is a schematic view of a structure of a chip module in the conventional technology.

| Reference numerals: | |
|---|---|
| 1-lower cover; | 11-upper plate; |
| 12-lower plate; | 13-sandwiching block; |
| 2-circuit board; | 21-slot; |
| 211-elastic terminal; | 212-limiting block; |
| 3-lidded packaged chip; | 31-lid; |
| 4-heat radiator; | 41-accommodating groove; |
| 5-lidless packaged chip; | 51-substrate; |
| 511-reinforcing rib; | 52-die; |
| 6-substrate fixing assembly; | 61-upper cover; |
| 611-hollow structure; | 612-elastic metal; |
| 613-bracket; | 614-pressing metal; |
| 615-spring set; | 62-elastic pressing block; |
| 621-elastic piece; | 622-pressing block; |
| 7-pre-tightening assembly; | 71-pre-tightening screw; |
| 72-spring; | 73-first fastening screw; |
| 74-second fastening screw; | 75-latch; |
| 8-heat conduction layer. | |

DESCRIPTION OF EMBODIMENTS

To make objectives, technical solutions, and advantages of this application clearer, the following further describes this application in detail with reference to accompanying drawings.

Terms used in the following embodiments are merely intended to describe particular embodiments, but are not intended to limit this application. The terms "one", "a" and "this" of singular forms used in this specification and the appended claims of this application are also intended to include expressions such as "one or more", unless otherwise specified in the context clearly.

Referring to "an embodiment" or "some embodiments" or the like described in this specification means that one or more embodiments of this application include a specific feature, structure, or characteristic described with reference to the embodiment. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise specifically emphasized in another manner. The terms "include", "have", and their variants all mean "include but are not limited to", unless otherwise specifically emphasized in another manner.

With development of electronic technologies, performance of a die used as a core component of an electronic device has attracted attention of persons skilled in the art. In the conventional technology, a chip in an electronic device such as a mobile phone, a computer, a smart wearable device, or a smart home appliance has a die inside. To improve protection of a die and implement communication of the die, it is usually necessary to dispose the die in a lidded packaged chip and then mount the packaged chip on a circuit board to form a chip module. FIG. 1 is a schematic view of a structure of a chip module in the conventional technology. The chip module includes a lower cover 1, a circuit board 2, a lidded packaged chip 3, and a heat radiator 4. The lidded packaged chip 3 is mounted on one side of the circuit board 2 facing away from the lower cover 1, and the heat radiator 4 is press-fitted on one side of the lidded packaged chip 3 facing away from the circuit board 2. A slot 21 is disposed on a surface of one side of the circuit board 2, and the slot 21 is connected to the lidded packaged chip 3. An elastic terminal 211 is provided in the slot 21. The heat radiator 4 applies pressure to the lidded packaged chip 3, so that a connecting part (not shown in the figure) of the lidded packaged chip 3 is connected to the elastic terminal 211 in the slot 21 disposed on the circuit board 2. In this solution, the heat radiator 4 applies pressure to a lid 31 of the lidded packaged chip 3, and the pressure may be applied to an entire top surface of the lidded packaged chip 3 more evenly under action of the lid 31, so that the connecting part of the lidded packaged chip 3 is reliably connected to the elastic terminal 211 in the slot 21 of the circuit board 2. With emergence of a lidless packaged chip 5, because the lidless packaged chip 5 does not have a lid 31, and flatness of a surface (or referred to as a top surface) on one side of the lidless packaged chip 5 facing away from the circuit board 2 is poor, pressure of a heat radiator 4 cannot be evenly distributed. Therefore, a problem that a heat dissipation effect is poor or that a die 52 is damaged is caused. Therefore, this application provides a chip module and an electronic device, so that a lidless packaged chip 5 is reliably connected to a slot 21 of a circuit board 2, thereby improving a service life of the lidless packaged chip 5. The following describes the technical solutions of this application in detail with reference to the accompanying drawings and embodiments.

Figure 2:
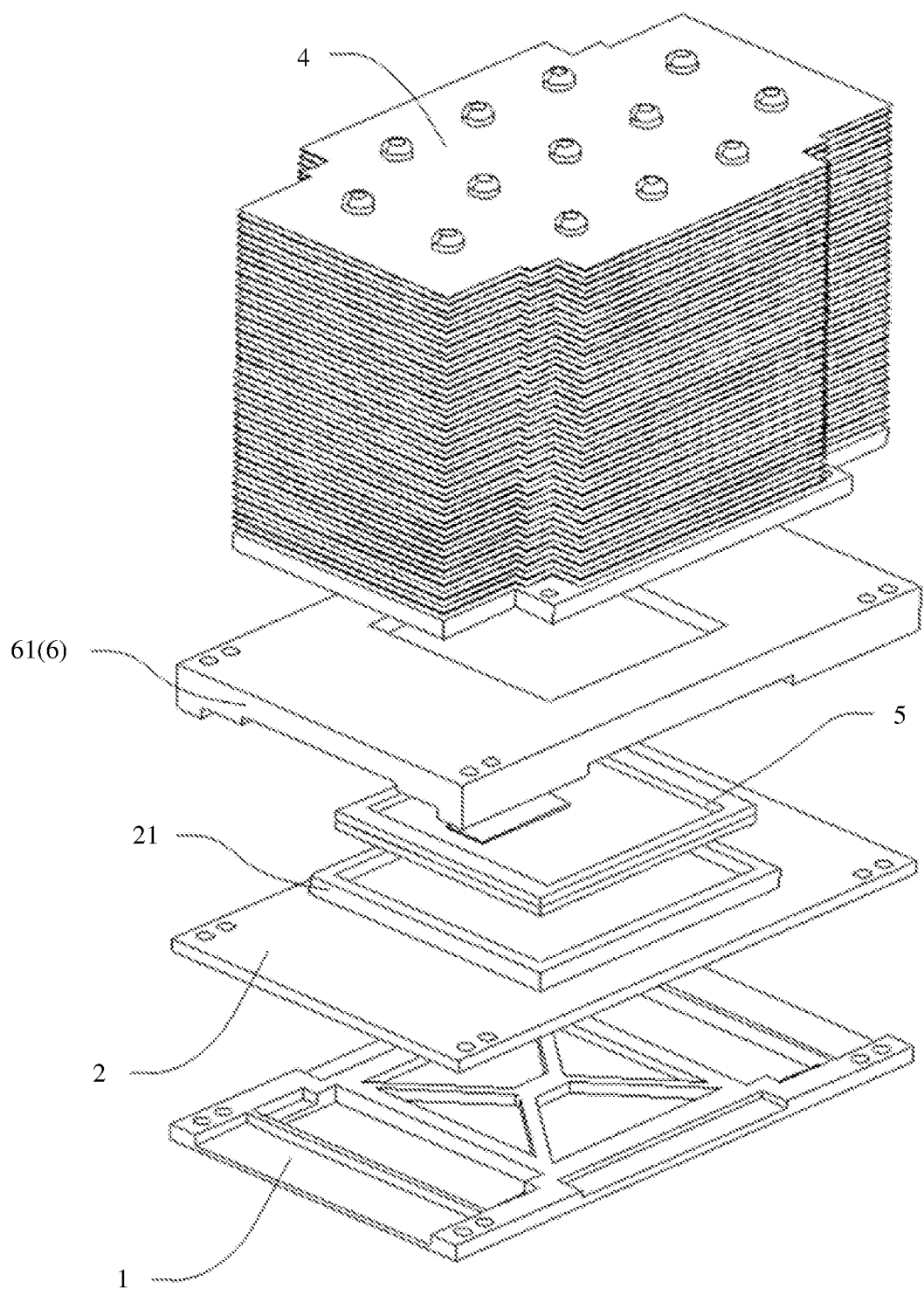
FIG. 2 is a schematic exploded view of a structure of a chip module according to an embodiment of this application.
Figure 3:
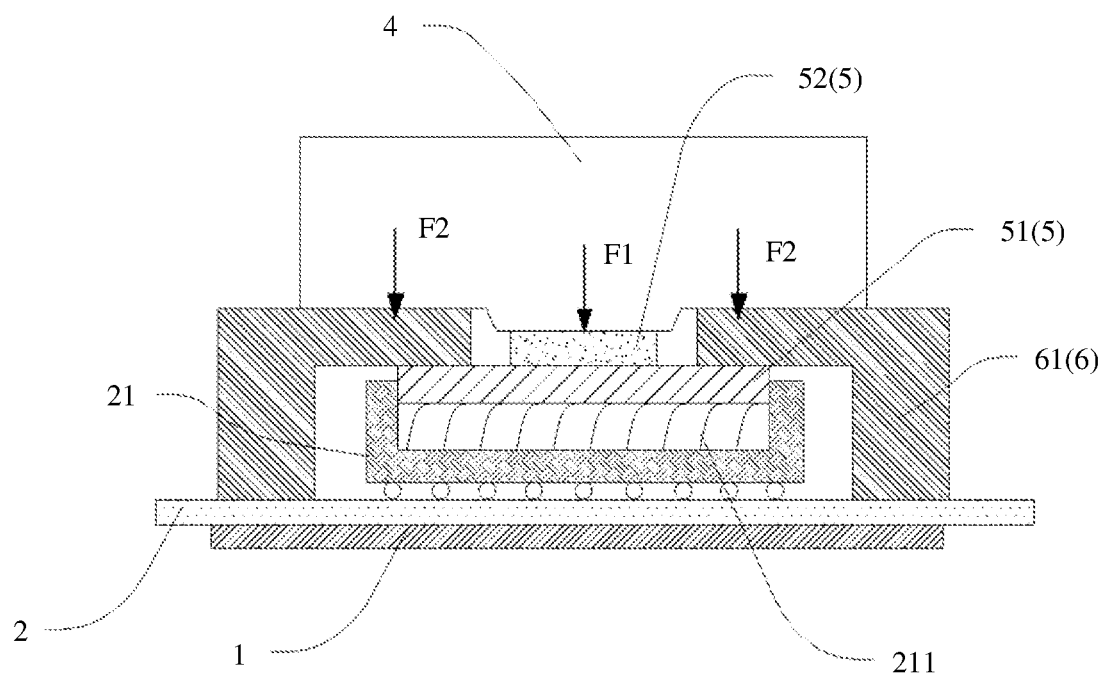
FIG. 3 is a schematic sectional view of a structure of a chip module according to an embodiment of this application.

FIG. 2 is a schematic exploded view of a structure of a chip module according to an embodiment of this application. FIG. 3 is a schematic sectional view of a structure of the chip module according to an embodiment of this application. As shown in FIG. 2 and FIG. 3, the chip module includes a circuit board 2, a lidless packaged chip 5, a heat radiator 4, and a substrate fixing assembly 6. The lidless packaged chip 5 includes a substrate 51 and a die 52. The die 52 is packaged on the substrate 51. The lidless packaged chip 5 is electrically connected to the circuit board 2. Specifically, a slot 21 is disposed on the circuit board 2, an elastic terminal 211 is provided in the slot 21, one side of the substrate 51 facing away from the die 52 has a connecting part electrically connected to the die 52, and the connecting part is connected to the elastic terminal 211 in the slot 21. The connecting part may be a pin or may be a pad. This is not limited in this application. To implement a reliable connection between the lidless packaged chip 5 and the slot 21 of the circuit board 2, the heat radiator 4 is press-fitted on one side of the die 52 facing away from the circuit board 2, so that pressure toward the circuit board 2 is applied to the die 52. The substrate fixing assembly 6 is press-fitted at a periphery of one side of the substrate 51 facing away from the circuit board 2 and avoids the die 52, so that pressure toward the circuit board 2 is applied to the periphery of the substrate 51. In other words, the substrate fixing assembly 6 applies pressure to an edge of the lidless packaged chip 5, so that there is even pressure between the lidless packaged chip 5 and the slot 21 of the circuit board 2 and that a connection between the edge of the lidless packaged chip 5 and the slot 21 of the circuit board 2 is reliable. In this solution, the chip module has the lidless packaged chip 5 with a good heat dissipation effect, and the lidless packaged chip 5 can be reliably connected to the circuit board 2.

Figure 4:
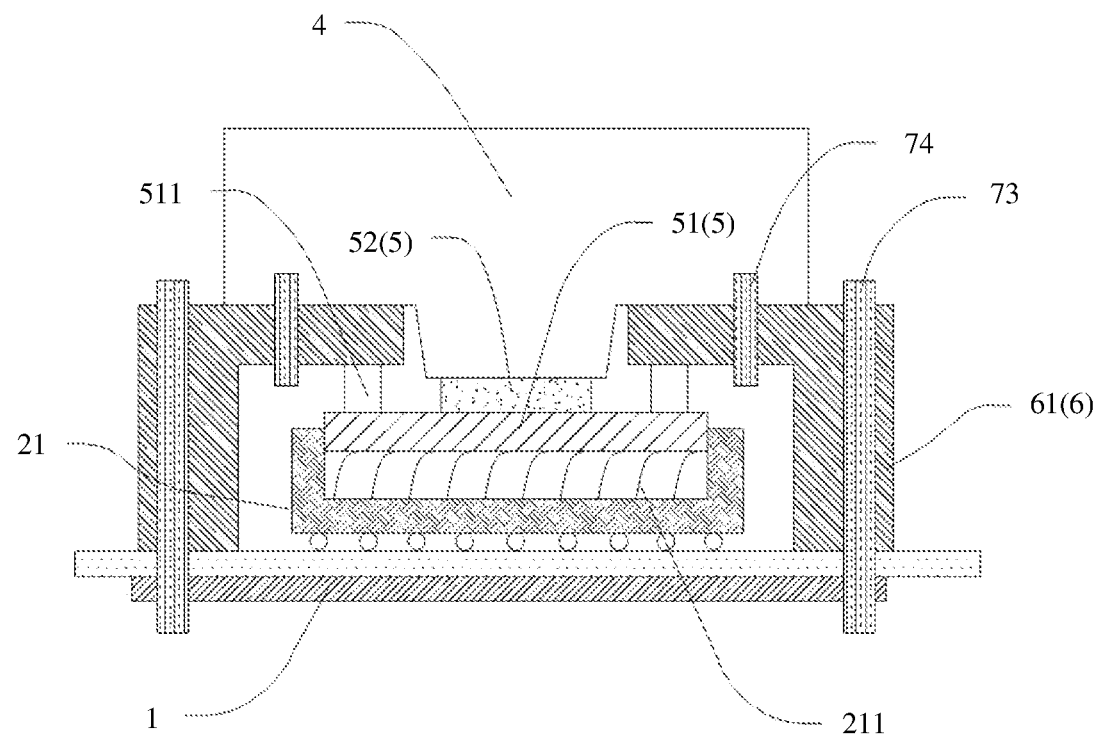
FIG. 4 is a schematic sectional view of another structure of a chip module according to an embodiment of this application.

FIG. 4 is a schematic sectional view of another structure of the chip module according to an embodiment of this application. Referring to FIG. 4, to improve structural strength of the lidless packaged chip 5 and reduce a warping degree, a reinforcing rib 511 (ring) is further disposed on the substrate 51. The reinforcing rib 511 is located on one side of the substrate 51 facing toward the die 52, that is, the reinforcing rib 511 and the die 52 are located on the same side of the substrate 51, and the reinforcing rib 511 is disposed around the die 52. The substrate fixing assembly 6 may be press-fitted on one side of the reinforcing rib 511 facing away from the circuit board 2. This solution can not only improve strength of the substrate 51, but also prevent the substrate fixing assembly 6 from being directly fixed to the substrate 51, thereby reducing damage to the substrate 51.

In a specific technical solution, a heat conduction layer may be disposed between the heat radiator 4 and the die 52 to improve heat conductivity between the die 52 and the heat radiator 4 and improve a heat dissipation effect of the lidless packaged chip 5. Specifically, the heat conduction layer may be a phase-change material layer, a carbon fiber layer, a graphite layer, or the like. This is not limited in this application.

Figure 5:
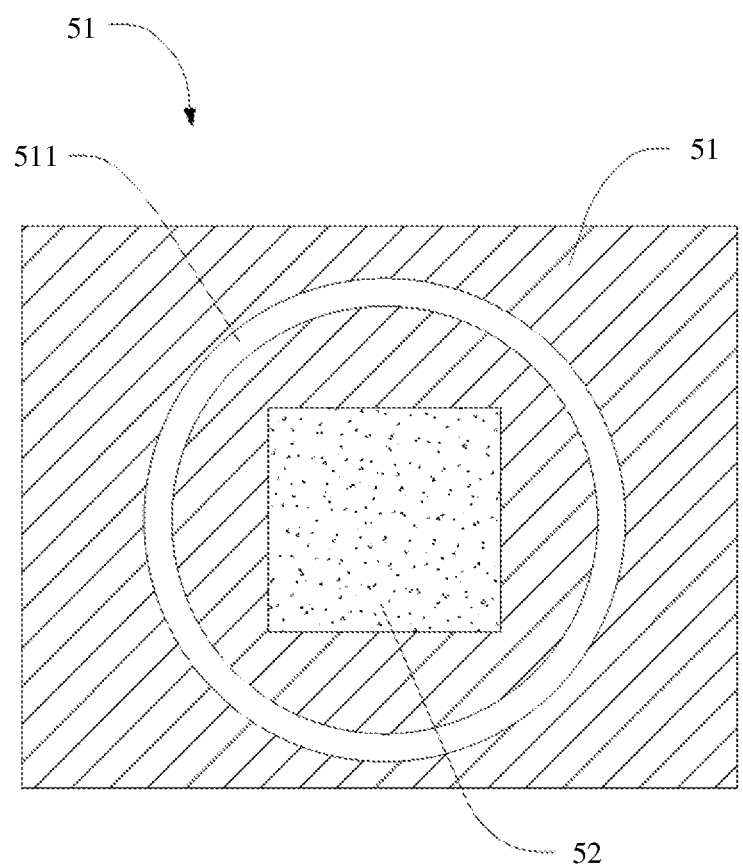
FIG. 5 is a schematic view of a layout of a reinforcing rib of a lidless packaged chip according to an embodiment of this application.
Figure 6:
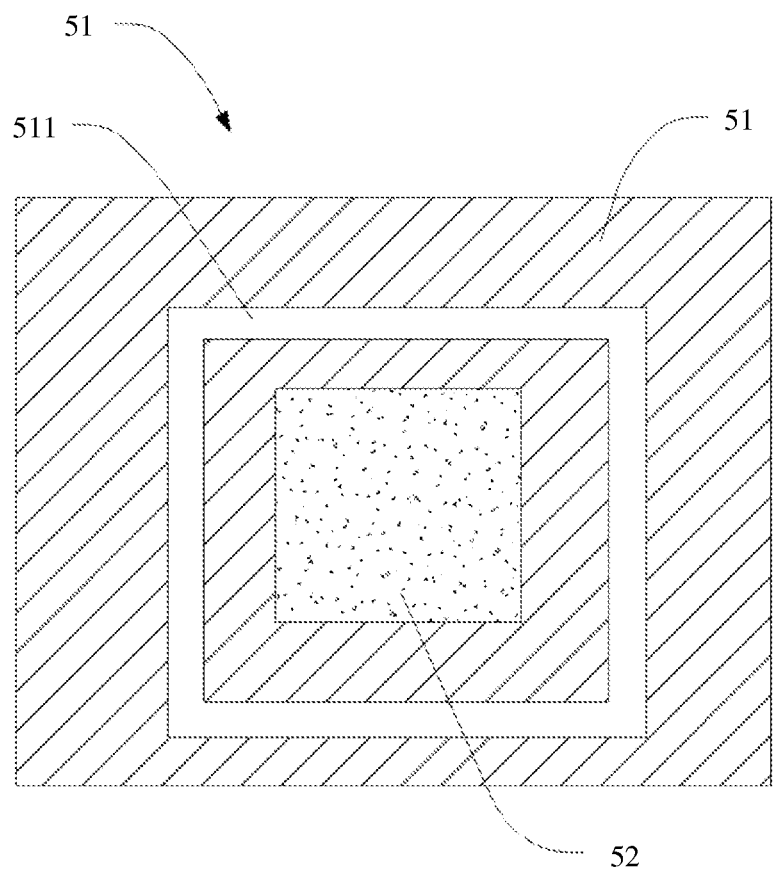
FIG. 6 is a schematic view of another layout of a reinforcing rib of a lidless packaged chip according to an embodiment of this application.
Figure 7:
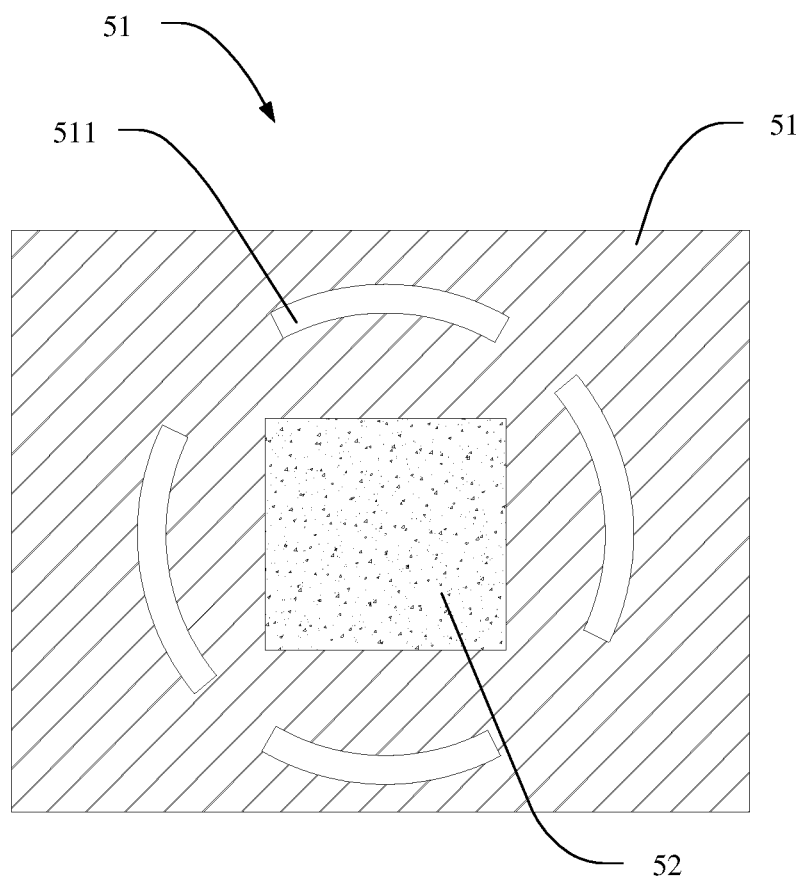
FIG. 7 is a schematic view of another layout of a reinforcing rib of a lidless packaged chip according to an embodiment of this application.

FIG. 5 to FIG. 7 are schematic diagrams of layouts of the reinforcing rib 511 of the lidless packaged chip 5 according to an embodiment of this application. Refer to FIG. 5 to FIG. 7. A specific structure of the reinforcing rib 511 is not limited. The reinforcing rib 511 is a ring. As shown in FIG. 5, the reinforcing rib 511 is a circular ring reinforcing rib, and the circular ring reinforcing rib is disposed on an outer peripheral side of the die 52. As shown in FIG. 6, the reinforcing rib 511 is a square ring reinforcing rib, and the square ring reinforcing rib is disposed on the outer peripheral side of the die 52. As shown in FIG. 7, the reinforcing rib 511 may further include a plurality of reinforcing rib sub-parts distributed on the outer peripheral side of the die 52.

Still referring to FIG. 3, pressure between the heat radiator 4 and the die 52 is F1, pressure between the substrate fixing assembly 6 and the substrate 51 is F2, and F1 and F2 satisfy: F1>F2. Usually, during manufacturing of the lidless packaged chip 5, because the die 52 needs to be packaged on the substrate 51, the lidless packaged chip 5 after the packaging has a crying warp, that is, the lidless packaged chip 5 has a protruding warp in a direction toward the die 52 and away from the substrate 51. In the pressure F1 between the heat radiator 4 and the die 52, a part of force is used to correct the warp, and another part of force presses an area of the lidless packaged chip 5 opposite to the die 52 toward the circuit board 2, so that F1 is greater than F2. In this case, there may be even pressure between the lidless packaged chip 5 and the slot 21 of the circuit board 2. Therefore, reliability of the connection between the lidless packaged chip 5 and the circuit board 2 is improved.

In a specific design of the chip module, when the pressure between the heat radiator 4 and the die 52 is F1 and the pressure between the substrate fixing assembly 6 and the substrate 51 is F2, it is possible to make F1:F2 greater than or equal to 3:2. The inventors have performed a lot of experiments and simulations and confirmed that when F1 and F2 satisfy the foregoing ratio, there can be a good mounting effect and the pressure between the lidless packaged chip 5 and the circuit board 2 is even.

Figure 8:
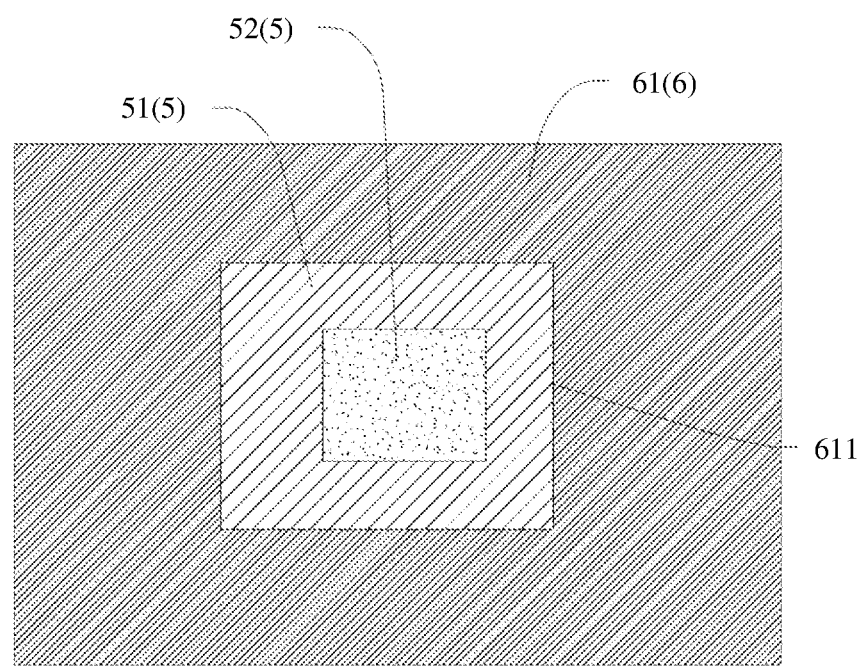
FIG. 8 is a schematic top view of a structure of a chip module after a heat radiator is removed according to an embodiment of this application.

Referring to FIG. 4 and FIG. 8, FIG. 8 is a schematic top view of the structure of the chip module after the heat radiator 4 is removed. When the substrate fixing assembly 6 is specifically disposed, the substrate fixing assembly 6 may be an upper cover 61. The upper cover 61 has a hollow structure 611, thereby avoiding the die 52 of the lidless packaged chip 5. In addition, the upper cover 61 is in contact with the substrate 51 to apply pressure to the substrate 51. The heat radiator 4 is in contact with the die 52 by using the hollow structure 611, so that the heat radiator 4 can apply pressure to the die 52. When the heat radiator 4 is specifically manufactured, the heat radiator 4 may have a protrusion in a direction toward the circuit board 2, and the protrusion may pass through the hollow structure 611 and may be in contact with the die 52. Pressure is separately applied to the die 52 and the substrate 51 of the lidless packaged chip 5, and a tolerance between the die 52 and the substrate 51 can be absorbed. Therefore, reliability of the electrical connection between the lidless packaged chip 5 and the circuit board 2 is improved. Certainly, in a specific technical solution, the heat radiator 4 may be in contact with the die 52 through the hollow structure 611. Alternatively, the die 52 may be in contact with the heat radiator 4 through the hollow structure 611. Alternatively, a contact area between the heat radiator 4 and the die 52 is located in the hollow structure 611.

When the upper cover 61 is specifically disposed, a specific structure of the upper cover 61 is not limited. For example, the upper cover 61 may be an integrally formed upper cover 61 with an integral structure. Alternatively, the upper cover 61 may include a plurality of sub-cover parts, and the upper cover 61 may be formed by splicing the plurality of sub-cover parts.

Figure 9:
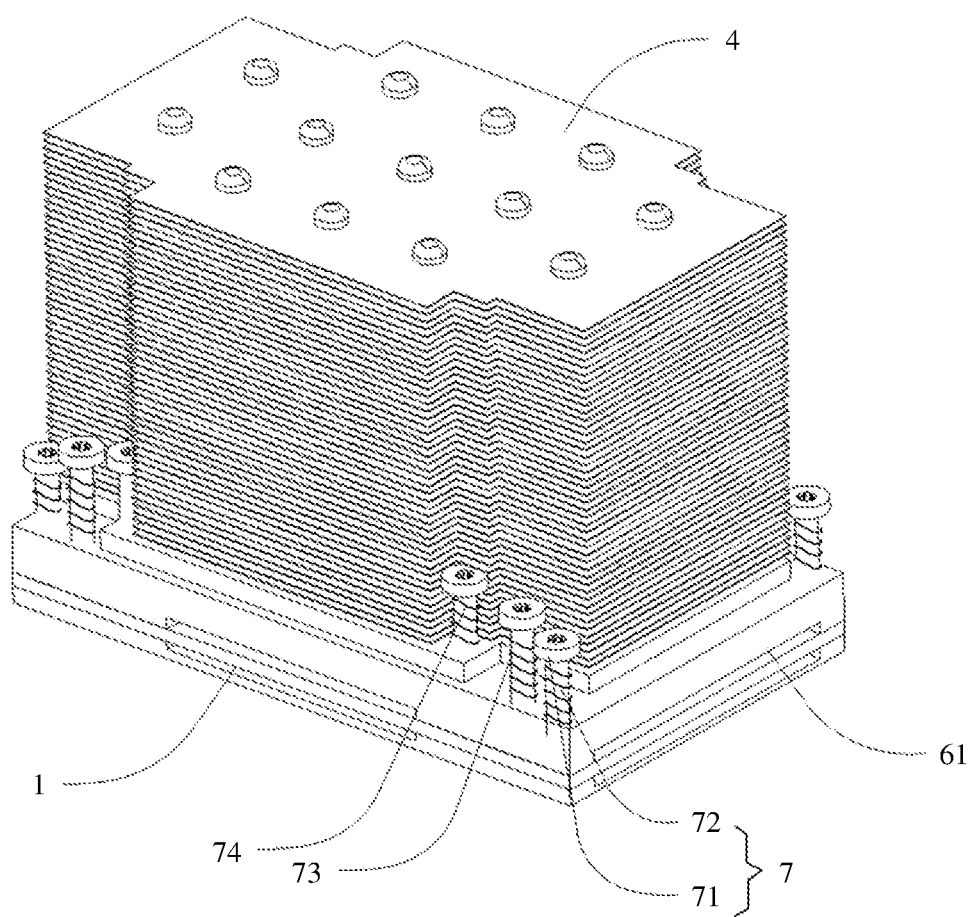
FIG. 9 is a schematic view of a structure of a chip module according to an embodiment of this application.

FIG. 9 is a schematic view of a structure of the chip module according to an embodiment of this application. To mount the chip module, a pre-tightening assembly 7 may be disposed between the upper cover 61 and the lower cover 1 of the chip module, and the pre-tightening assembly 7 can make the upper cover 61 have a trend of getting close to the lower cover 1, to facilitate a subsequent mounting operation. Specifically, a value of pressure of the upper cover 61 toward the substrate 51 can be easily adjusted.

When the pre-tightening assembly 7 is specifically disposed, the pre-tightening assembly 7 may include a pre-tightening screw 71 and a spring 72 sleeved outside the pre-tightening screw 71, and the pre-tightening screw 71 only pre-connects the upper cover 61 and the lower cover 1. Specifically, a connecting part of the substrate 51 of the lidless packaged chip 5 may not be in contact with the elastic terminal 211 in the slot 21, or may be in non-contact with the elastic terminal 211 in the slot 21. In short, the connecting part is not completely fixed to the elastic terminal 211 in the slot 21. Because the spring 72 is sleeved outside the pre-tightening screw 71, connecting force F3 between the upper cover 61 and the lower cover 1 is controlled by controlling torque of the pre-tightening screw 71. The connecting force F3, the pressure F1 between the heat radiator 4 and the die 52, and the pressure F2 between the substrate fixing assembly 6 and the substrate 51 satisfy the following relationship: F3<F2<F1. This solution is advantageous for mounting of a chip module with a large size.

When the spring is specifically disposed, the spring may be a pre-tightening spring (torsion spring), that is, after torque is preset, the pre-tightening screw with the pre-tightening spring is mounted and connected to the upper cover and the lower cover. In this case, the required connecting force F3 may exist between the upper cover and the lower cover. The mounting process of this solution is simple. Alternatively, the spring may be a common compression spring, and the pre-tightening screw is mounted by using a torque screwdriver when the pre-tightening screw is mounted. When the torque of the torque screwdriver satisfies a requirement, the required connecting force F3 exists between the upper cover and the lower cover. In this solution, costs of the spring are low. Alternatively, when the spring is a common compression spring, the connecting force F3 may be controlled by controlling a compression stroke of the spring, but precision of this solution is low.

In another specific embodiment, the pre-tightening assembly 7 may further include a structure such as an elastic metal or an elastic hook. Details are not described in this application.

Figure 10:
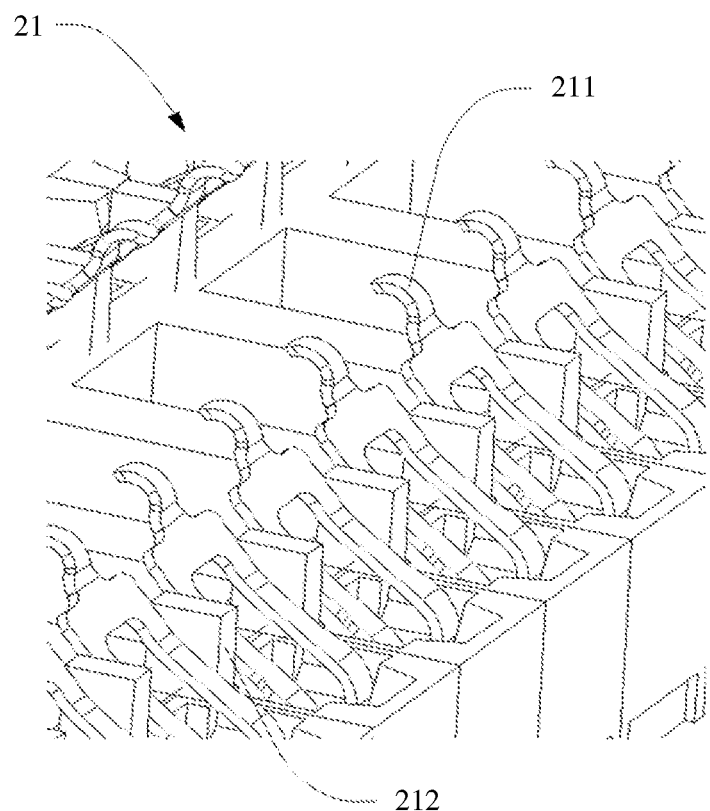
FIG. 10 is a schematic partial view of a structure of a slot according to an embodiment of this application.

FIG. 10 is a schematic partial view of a structure of the slot 21 according to an embodiment of this application. The slot 21 includes the elastic terminal 211 and a limiting block 212. With reference to FIG. 4, the limiting block 212 limits the lidless packaged chip 5 in a direction toward the lidless packaged chip 5. By properly setting a size relationship between the limiting block 212 and the elastic terminal 211, when the substrate 51 of the lidless packaged chip 5 is in contact with the limiting block 212, the connecting part of the substrate 51 is reliably connected to the elastic terminal 211, and elasticity of the elastic terminal 211 is not damaged. Therefore, reliability of the electrical connection and a service life of the chip module are improved.

Still referring to FIG. 9, the upper cover 61 and the lower cover 1 may be connected by using a first fastening screw 73, so that the upper cover 61 applies the specified pressure F2 to the substrate 51. A spring 72 is sleeved outside the first fastening screw 73, and the spring 72 is in a compressed state. The spring may provide pressure for pressing the upper cover 61 toward the substrate 51, so that the substrate 51 can be pressed toward the circuit board 2. Specifically, when the first fastening screw 73 is mounted, a value of the pressure F2 applied by the upper cover 61 to the substrate 51 may be determined based on torque of the first fastening screw 73. In other words, the torque that needs to be applied to the first fastening screw 73 may be determined based on the required pressure F2 applied to the substrate 51 by the upper cover 61, to satisfy a product requirement. After the first fastening screw 73 is mounted, the lidless packaged chip 5 is in contact with the limiting block 212 of the circuit board 2, and the connecting part is reliably connected to the elastic terminal 211.

When the heat radiator 4 is mounted, the heat radiator 4 may be connected to the upper cover 61, or the heat radiator 4 may be connected to the lower cover 1. This is not limited in this application. However, when the heat radiator 4 is specifically mounted, the heat radiator 4 may be connected to the upper cover 61 or the lower cover 1 by using a second fastening screw 74. A spring 72 is also sleeved outside the second fastening screw 74, and the spring is in a compressed state. The spring may provide pressure for pressing the heat radiator 4 toward the die 52, so that the die 52 is pressed toward the circuit board. Specifically, when the second fastening screw is mounted, a value of the pressure F1 applied by the heat radiator 4 to the die 52 may be determined by adjusting torque of the second fastening screw 74. In other words, the torque that needs to be applied to the second fastening screw 74 may be determined based on the required pressure F1 applied to the die 52 by the heat radiator 4.

When the spring outside the first fastening screw and the spring outside the second fastening screw are specifically disposed, the springs may be pre-tightening springs (torsion springs), that is, after torque is preset and the screws with the pre-tightening springs are mounted, the specified pressure may be formed. The mounting process of this solution is simple. Alternatively, the spring may be a common compression spring, and the screw is mounted by using a torque screwdriver when the screw is mounted, and the mounting is completed when the torque of the torque screwdriver satisfies a requirement. In this solution, costs of the spring are low. Alternatively, when the spring is a common compression spring, the pressure may be controlled by controlling a compression stroke of the spring, but precision of this solution is low.

Figure 11:
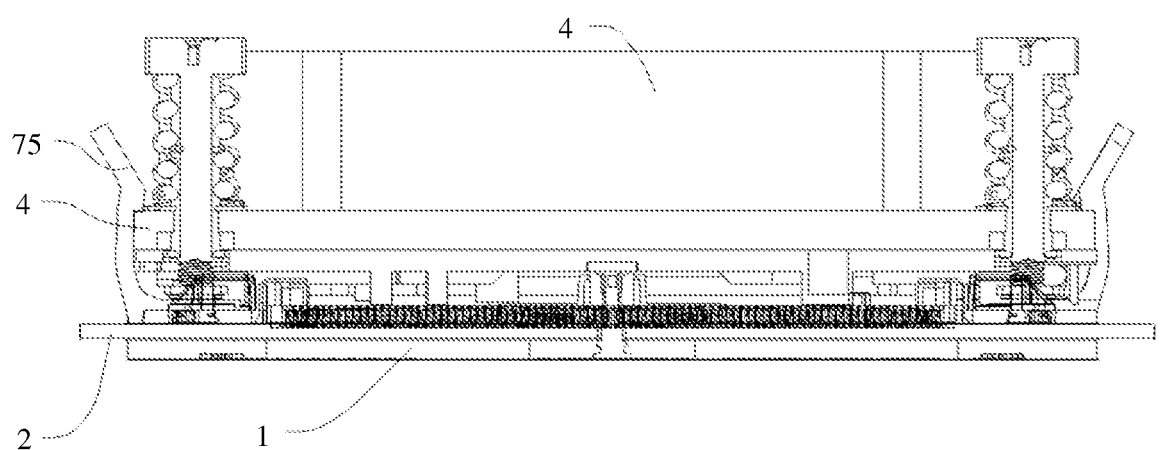
FIG. 11 is a partial sectional view of a chip module according to an embodiment of this application.

FIG. 11 is a partial sectional view of the chip module according to an embodiment of this application. A plurality of latches 75 are further fixed to the lower cover 1, and the latches 75 are clamped with the protrusion of the edge of the heat radiator 4, so that the heat radiator 4 can be pre-mounted. Specifically, the plurality of latches 75 may be evenly distributed on a peripheral side of the lower cover 1, so that the heat radiator 4 and the lower cover 1 keep stable and are not prone to tilt. In this way, the die 52 is prevented from being damaged by impact of concentrated stress of the heat radiator 4, and the service life of the chip module is improved. In particular, the heat radiator 4 may be mounted after the upper cover 61 and the lower cover 1 are pre-mounted. In this case, the heat radiator 4 is pre-fixed with the lower cover 1 by using the latches 75, so that when the second fastening screw 74 is mounted in a direction, the heat radiator 4 is unlikely to be skewed due to absence of a fixing structure in a direction opposite to the direction when the heat radiator 4 is subsequently mounted. This solution is advantageous for mounting of a chip module with a large size.

Figure 12:
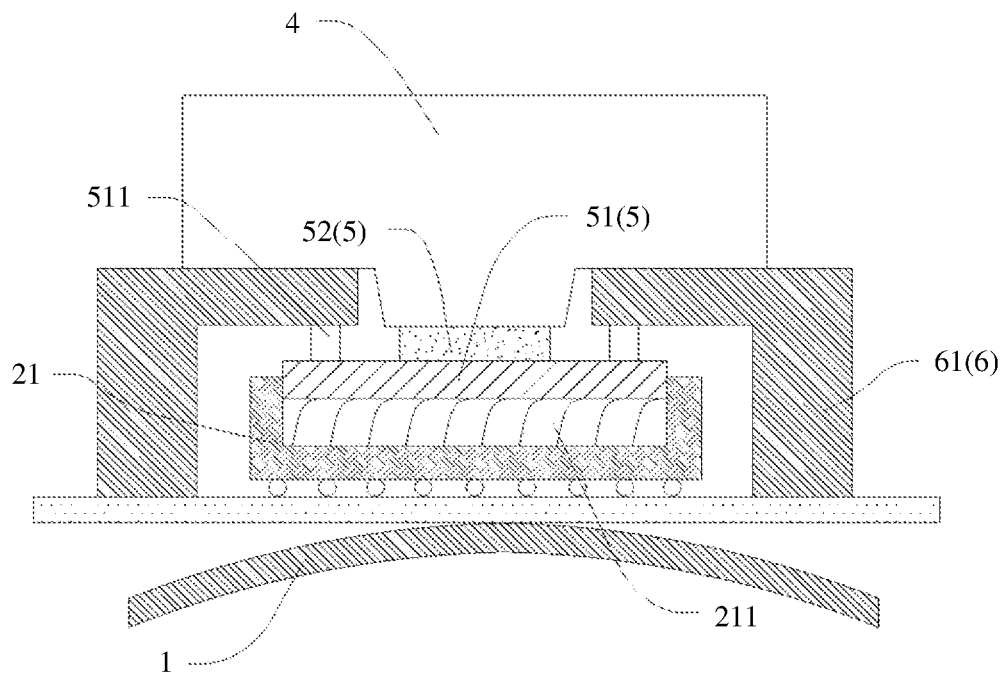
FIG. 12 is a schematic sectional view of another structure of a chip module according to an embodiment of this application.

FIG. 12 is a schematic sectional view of another structure of the chip module according to an embodiment of this application. With reference to FIG. 4, referring to FIG. 12, the lower cover 1 is a pre-bent lower cover 1. When the pre-bent lower cover is in a natural state, an edge of the pre-bent lower cover 1 is bent in a direction away from the circuit board 2. In other words, when not mounted, the lower cover 1 is in a bent shape, as shown in FIG. 12. In this solution, after the lidless packaged chip 5 is mounted on the circuit board 2, an area in which the die 52 is located tends to deform toward the circuit board 2. After the mounting is completed, the pre-bent lower cover 1 may counteract the foregoing deformation trend of the lidless packaged chip 5, so that the chip module remains in a flat state, as shown in FIG. 4. This helps improve reliability of the connection between the lidless packaged chip 5 and the slot 21 of the circuit board 2.

Figure 13:
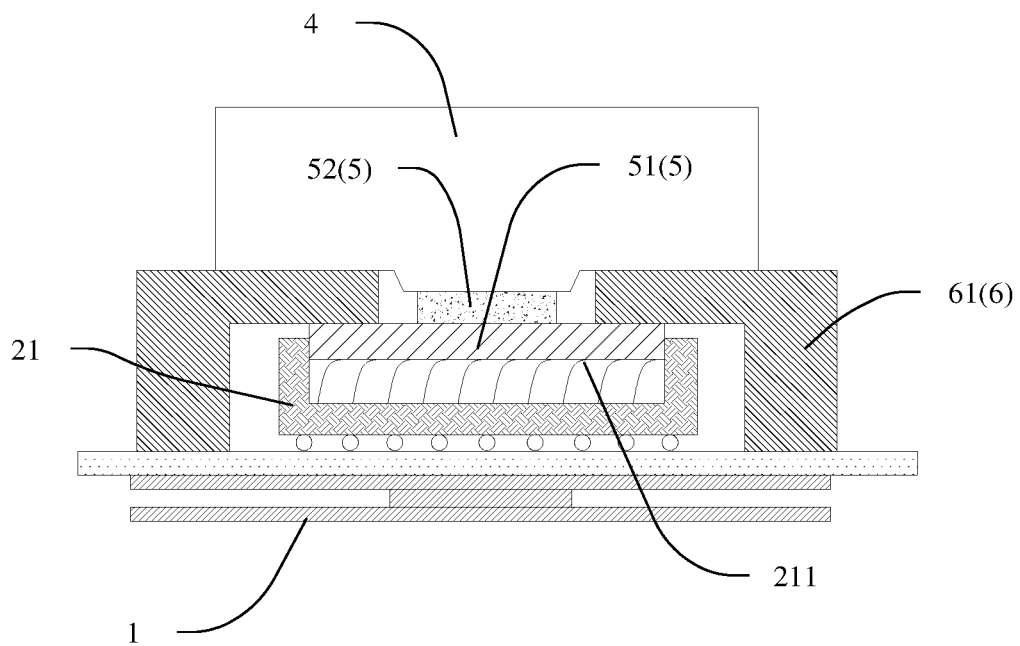
FIG. 13 is a schematic sectional view of another structure of a chip module according to an embodiment of this application.
Figure 14:
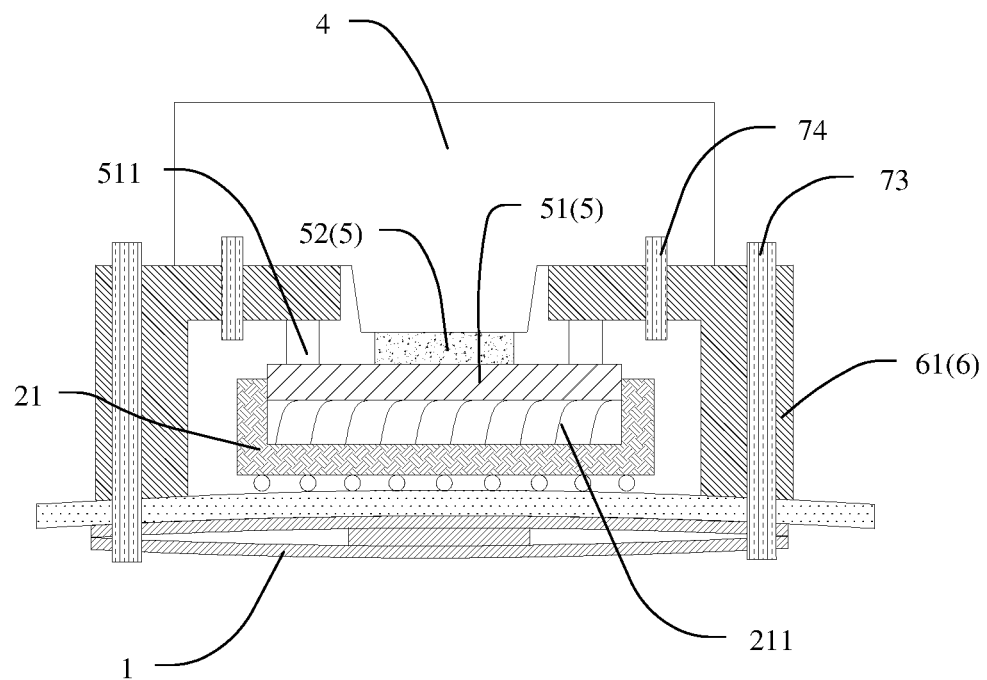
FIG. 14 is a schematic sectional view of another structure of a chip module according to an embodiment of this application.

FIG. 13 is a schematic sectional view of another structure of the chip module according to an embodiment of this application. Specifically, FIG. 13 shows a structure in a state in which the lower cover is not mounted. The lower cover 1 may be an I-shaped lower cover. To be specific, the I-shaped lower cover includes an upper plate 11, a lower plate 12, and a sandwiching block 13. The sandwiching block 13 is located between the upper plate 11 and the lower plate 12, and may be specifically located in a middle area between the upper plate 11 and the lower plate 12. In this solution, after the lidless packaged chip 5 is mounted on the circuit board 2, the area in which the die 52 is located tends to deform toward the circuit board 2. FIG. 14 is a schematic sectional view of another structure of the chip module according to an embodiment of this application. Specifically, FIG. 14 shows a structure in a state in which the lower cover is mounted. After the lower cover 1 is mounted, a peripheral side of the I-shaped lower cover is tightened by using a screw, so that edge areas of the upper plate 11 and the lower plate 12 are close to each other. In this case, an area in which the sandwiching block 13 is raised, and this may counteract the foregoing deformation trend of the lidless packaged chip 5, so that the chip module remains in a flat state, as shown in FIG. 14. This helps improve reliability of the connection between the lidless packaged chip 5 and the slot 21 of the circuit board 2.

Figure 15:
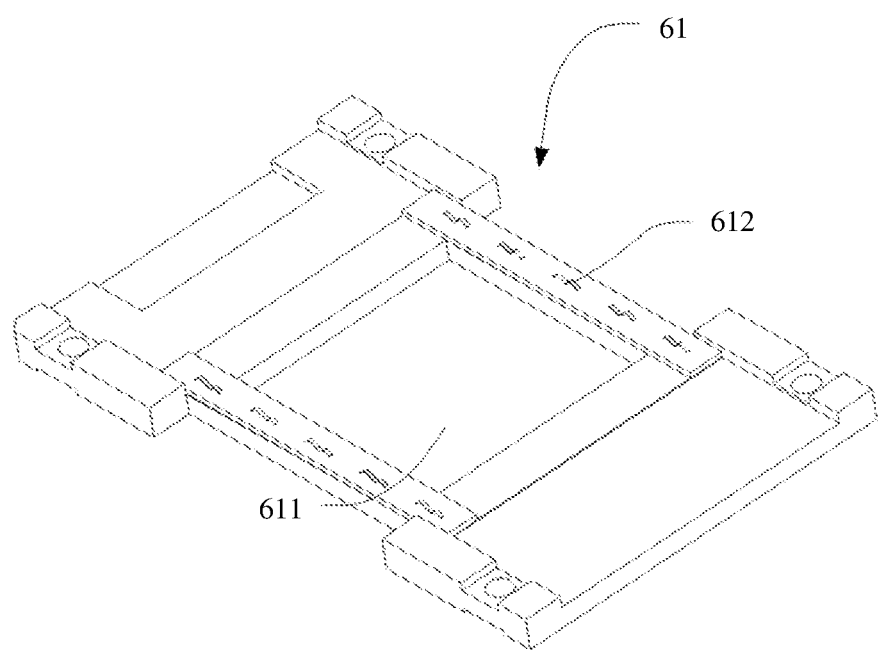
FIG. 15 is a schematic view of a structure of an upper cover according to an embodiment of this application.
Figure 16:
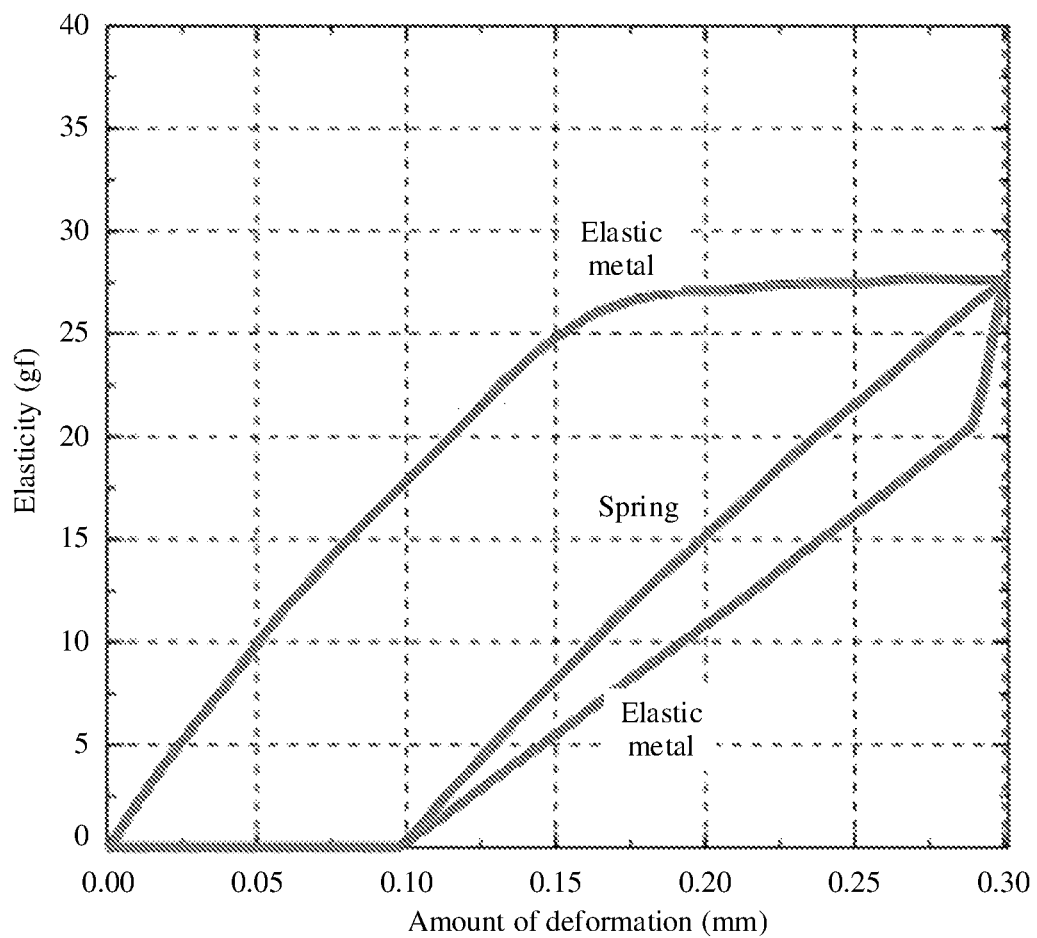
FIG. 16 is a curve chart of mechanical properties of an elastic metal and a spring.

FIG. 15 is a schematic view of a structure of the upper cover according to an embodiment of this application. With reference to FIG. 4, a plurality of elastic metals 612 may be further disposed on the upper cover 61, and the elastic metals 612 of the upper cover 61 are press-fitted on the substrate 51. The elastic metals 612 may provide pressure for pressing the substrate 51 toward the circuit board 2. In this solution, elastic force of the elastic metals 612 can be used to adjust the pressure F2 between the upper cover 61 and the substrate 51. In this solution, pressure of the upper cover 61 on the lidless packaged chip 5 may be precisely controlled by adjusting specific positions and elastic performance of the elastic metals 612. FIG. 16 is a curve chart of mechanical properties of an elastic metal and a spring. There is a linear growth relationship between elastic force of the spring and an amount of deformation of the spring. If the amount of deformation of the spring is larger, the elastic force of the spring is stronger. A relationship between elastic force of the elastic metal and an amount of deformation of the elastic metal is first an approximately linear growth relationship. When the amount of deformation of the elastic metal reaches a value, the elastic force of the elastic metal tends to become stable and will not increase greatly. In the technical solution of this application, compared with the spring sleeved outside the first fastening screw 73, the elastic metal 612 has a reliable structure and higher adaptability, and overpressure of the upper cover 61 on the substrate 51 is unlikely to occur.

Figure 17:
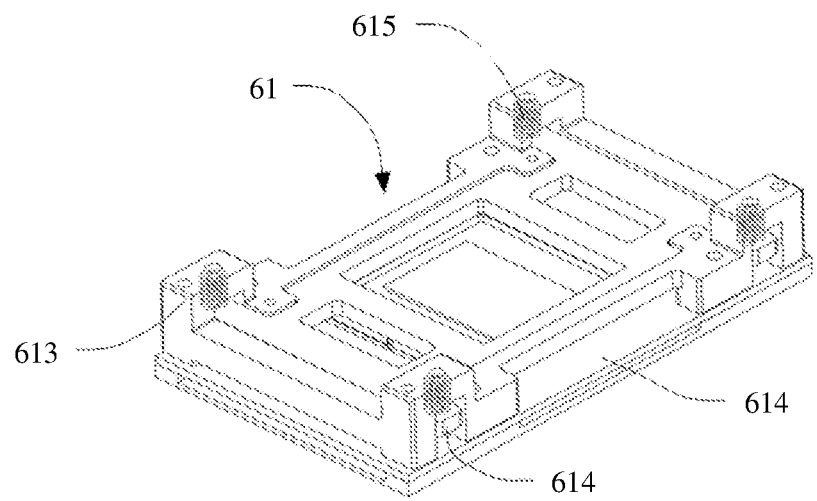
FIG. 17 is a schematic view of another structure of an upper cover according to an embodiment of this application.

FIG. 17 is a schematic view of another structure of the upper cover 61 according to an embodiment of this application. In another technical solution, the upper cover 61 may further include a bracket 613 and a pressing metal 614, and the bracket 613 is fixedly connected to the lower cover 1. A spring set 615 is connected between the pressing metal 614 and the bracket 613, and the pressing metal 614 is press-fitted on the substrate 51 under action of pressure of the spring set 615. The pressure F2 between the upper cover 61 and the substrate 51 is adjusted by adjusting elastic force of the spring set 615.

Figure 18:
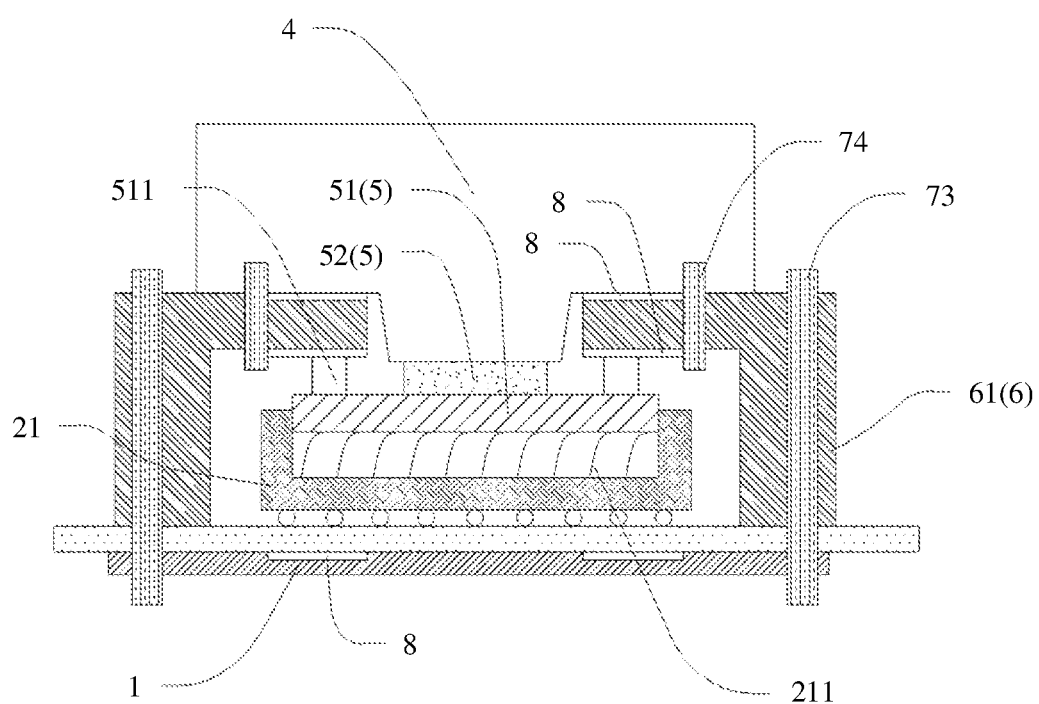
FIG. 18 is a schematic sectional view of another structure of a chip module according to an embodiment of this application.

FIG. 18 is a schematic sectional view of another structure of the chip module according to an embodiment of this application. To improve a heat dissipation capability of the chip module, a heat conduction layer 8 is provided on both a surface of the upper cover 61 facing toward the heat radiator 4 and a surface of the upper cover 61 facing away from the heat radiator 4. Therefore, heat of the substrate 51 of the lidless packaged chip 5 can be transferred to the heat radiator through the heat conduction layer 8 and the upper cover 61, so that the heat dissipation effect of the lidless packaged chip 5 is improved.

Further, a heat conduction layer 8 may also be disposed between the circuit board 2 and the lower cover 1, so that the chip module can also perform heat dissipation in a direction of the lower cover 1. In this case, an overall heat dissipation capability of the chip module is high, and this helps improve work efficiency of the chip module.

The heat conduction layer 8 may be specifically a metal layer or a graphite layer. This is not limited in this application. The heat conduction layer 8 may be an integral structure, or may include a plurality of sub-parts that form the heat conduction layer 8 as a whole.

Figure 19:
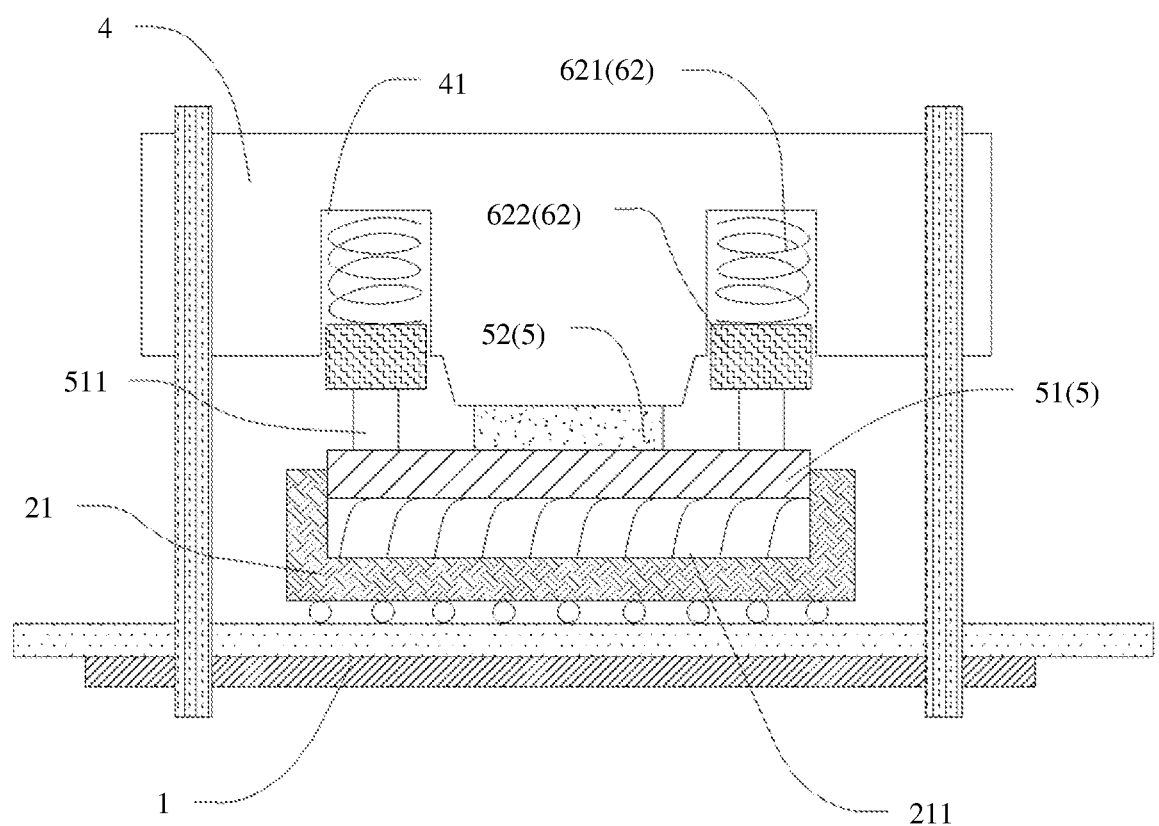
FIG. 19 is a schematic sectional view of another structure of a chip module according to an embodiment of this application.

FIG. 19 is a schematic sectional view of another structure of the chip module according to an embodiment of this application. In another embodiment of this application, the substrate fixing assembly 6 may be a plurality of elastic pressing blocks 62, and the elastic pressing blocks 62 are mounted on the heat radiator 4. The heat radiator 4 includes an accommodating groove 41, and the elastic pressing blocks 62 are disposed in the accommodating groove 41. Specifically, the elastic pressing block 62 may include an elastic piece 621 and a pressing block 622, and the pressing block 622 is disposed between the elastic piece 621 and the substrate 51. Specifically, the elastic piece 621 may be a spring, and the plurality of elastic pressing blocks 62 are press-fitted on a peripheral side of the substrate 51 and avoid the die 52 of the lidless packaged chip 5, to apply pressure F2 to the substrate 51, so that the lidless packaged chip 5 is reliably connected to the slot 21 of the circuit board 2. In this solution, the structure of the chip module is simple. When the heat radiator 4 is mounted, the heat radiator 4 may be first fixed to the lower cover 1, and then elastic force of the elastic pressing block 62 is adjusted.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A chip module, comprising a circuit board, a slot disposed on a surface of the circuit board, a lidless packaged chip, a heat radiator, and a substrate fixing assembly, wherein
   the lidless packaged chip comprises a substrate and a die packaged on the substrate, a connecting part of the lidless packaged chip is connected to an elastic terminal in the slot, the heat radiator is press-fitted on one side of the die, and the substrate fixing assembly is pressed at a periphery of one side of the substrate away from the circuit board and avoids contact with the die, wherein the one side of the die faces away from the circuit board, wherein the substrate fixing assembly is an upper cover, the upper cover has a hollow structure that avoids contact with the die, the heat radiator has a protrusion in a direction toward the circuit board, and wherein either the protrusion passes through the hollow structure and makes contact with the die, or a contact area between the protrusion and the die is located in the hollow structure.

2. The chip module according to claim 1, wherein the lidless packaged chip comprises a reinforcing rib disposed on the substrate; the reinforcing rib and the die are located on a same side of the substrate, and the reinforcing rib is disposed around the die; and the substrate fixing assembly is in contact with one side of the reinforcing rib, wherein the one side of the reinforcing rib faces away from the substrate.

3. The chip module according to claim 1, wherein pressure F1 between the heat radiator and the die and pressure F2 between the substrate fixing assembly and the substrate satisfy F1>F2.

4. The chip module according to claim 1, further comprising a lower cover disposed on one side of the circuit board, wherein the one side of the circuit board faces away from the substrate, and wherein a pre-tightening assembly is connected between the upper cover and the lower cover, and is configured to adjust a distance between the upper cover and the lower cover.

5. The chip module according to claim 4, wherein the pre-tightening assembly comprises a pre-tightening screw and a spring sleeved outside the pre-tightening screw.

6. The chip module according to claim 4, wherein the upper cover is connected to the lower cover by using a first fastening screw, a spring is sleeved outside the first fastening screw, and the spring is configured to provide pressure for pressing the upper cover toward the substrate.

7. The chip module according to claim 4, wherein the heat radiator is connected to the upper cover and/or the lower cover by using a second fastening screw, a spring is sleeved outside the second fastening screw, and the spring is configured to provide pressure for pressing the heat radiator toward the die.

8. The chip module according to claim 4, wherein a plurality of latches are fixed to the lower cover, an edge of the heat radiator has a protruding edge, and the latches are clamped with the protruding edge.

9. The chip module according to claim 4, wherein the lower cover is a pre-bent lower cover, and, when the pre-bent lower cover is in a natural state, an edge of the pre-bent lower cover is bent in a direction away from the circuit board.

10. The chip module according to claim 4, wherein the lower cover is an I-shaped lower cover.

11. The chip module according to claim 1, wherein the upper cover has an elastic metal, and the elastic metal is pressed on the substrate.

12. The chip module according to claim 1, wherein the upper cover comprises a bracket and a pressing metal, the pressing metal and the bracket are connected by using a spring set, and the spring set is in a compressed state.

13. The chip module according to claim 1, wherein a surface of the upper cover facing toward the heat radiator and a surface of the upper cover facing away from the heat radiator each have a heat conduction layer.

14. The chip module according to claim 1, wherein the substrate fixing assembly comprises a plurality of elastic pressing blocks, the elastic pressing blocks are mounted on the heat radiator, and the plurality of elastic pressing blocks are pressed on a periphery of a side of the substrate.

15. An electronic device, comprising a chip module which comprises a circuit board, a slot disposed on a surface of the circuit board, a lidless packaged chip, a heat radiator, and a substrate fixing assembly, wherein
the lidless packaged chip comprises a substrate and a die packaged on the substrate, a connecting part of the lidless packaged chip is connected to an elastic terminal in the slot, the heat radiator is press-fitted on one side of the die, and the substrate fixing assembly is pressed at a periphery of one side of the substrate away from the circuit board and avoids contact with the die, wherein the one side of the die faces away from the circuit board, wherein the substrate fixing assembly is an upper cover, and the upper cover has a hollow structure that avoids contact with the die, the heat radiator has a protrusion in a direction toward the circuit board, and wherein either the protrusion passes through the hollow structure and makes contact with the die, or a contact area between the protrusion and the die is located in the hollow structure.

16. The electronic device according to claim 15, wherein the lidless packaged chip comprises a reinforcing rib disposed on the substrate; the reinforcing rib and the die are located on a same side of the substrate, and the reinforcing rib is disposed around the die; and the substrate fixing assembly is in contact with one side of the reinforcing rib, away from the substrate wherein the one side of the reinforcing rib faces.

17. The electronic device according to claim 15, wherein pressure F1 between the heat radiator and the die and pressure F2 between the substrate fixing assembly and the substrate satisfy F1>F2.

18. The electronic device according to claim 15, wherein the substrate fixing assembly comprises a plurality of elastic pressing blocks, the elastic pressing blocks are mounted on the heat radiator, and the plurality of elastic pressing blocks are pressed on a peripheral periphery of a side of the substrate.

* * * * *